United States Patent [19]

Cronin et al.

[11] Patent Number: 5,760,461
[45] Date of Patent: Jun. 2, 1998

[54] VERTICAL MASK FOR DEFINING A REGION ON A WALL OF A SEMICONDUCTOR STRUCTURE

[75] Inventors: John Edward Cronin, Milton; Joseph Edward Gortych, Essex Junction, both of Vt.

[73] Assignee: International Business Machines Corporation, Armonk, N.Y.

[21] Appl. No.: 804,305

[22] Filed: Feb. 24, 1997

Related U.S. Application Data

[62] Division of Ser. No. 485,292, Jun. 7, 1995, Pat. No. 5,668,018.

[51] Int. Cl.$^6$ .................................................. H01L 29/06
[52] U.S. Cl. ........................................ 257/622; 257/798
[58] Field of Search ............................ 257/48, 797, 622, 257/798; 437/35, 36, 80, 225, 229

[56] References Cited

U.S. PATENT DOCUMENTS

| | | | |
|---|---|---|---|
| 3,908,262 | 9/1975 | Stein | 437/35 |
| 4,415,371 | 11/1983 | Soclof | 148/1.5 |
| 4,466,178 | 8/1984 | Soclof | 437/35 |
| 4,549,927 | 10/1985 | Goth et al. | 156/643 |
| 4,751,458 | 6/1988 | Elward, Jr. | 257/48 |
| 4,918,027 | 4/1990 | Fuse et al. | 437/35 |
| 5,047,359 | 9/1991 | Nagatomo | 437/35 |
| 5,096,849 | 3/1992 | Beilstein, Jr. et al. | 437/67 |
| 5,101,261 | 3/1992 | Maeda | 357/21 |
| 5,147,823 | 9/1992 | Ishibashi et al. | 437/225 |
| 5,306,390 | 4/1994 | Peek | 437/35 |
| 5,376,225 | 12/1994 | Wakabayashi et al. | 437/225 |
| 5,391,506 | 2/1995 | Tada et al. | 437/35 |
| 5,547,883 | 8/1996 | Kim | 437/35 |
| 5,578,508 | 11/1996 | Baba et al. | 437/35 |

FOREIGN PATENT DOCUMENTS

| | | | |
|---|---|---|---|
| 0020433 | 2/1982 | Japan | 437/36 |
| 4-348591 | 12/1992 | Japan | 250/505.1 |

OTHER PUBLICATIONS

Soychak et al., "Technique To Selectively Dope Semiconductor Trench Walls and Bottom," IBM Technical Disclosure Bulletin, vol. 30, No. 8, pp. 268–269, Jan. 1988.

Cronin et al., "Line and Via Intrerconnect Structure Using A Single Mask," IBM Technical Disclosure Bulletin, vol. 32, No. 12, pp. 146–147, May 1990.

Primary Examiner—Mark V. Prenty
Attorney, Agent, or Firm—Heslin & Rothenberg, P.C.

[57] ABSTRACT

A device and method are described for defining a region on a wall of a semiconductor structure, such as a sidewall of a trench formed in a semiconductor substrate. The method includes the steps of forming a vertical structure above the semiconductor structure and spaced parallel to the wall; providing within the vertical structure an area of one of transparence, reflection or refraction; and projecting light at a given angle to the wall, wherein only a portion of the light passes the vertical structure via the area provided therein to impinge upon the wall of the semiconductor structure, and thereby define the region on the wall. As an alternative, the area can comprise an aperture in the vertical structure such that the vertical structure can be employed as a mask to direct selective ion implantation of the wall.

12 Claims, 4 Drawing Sheets

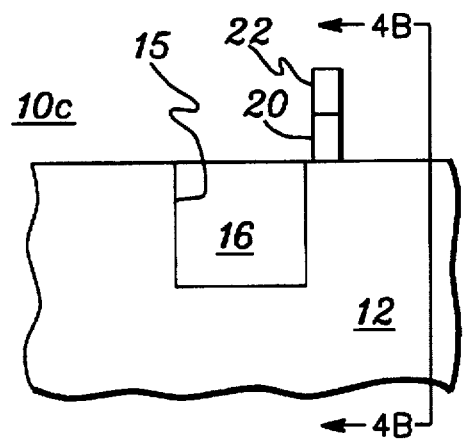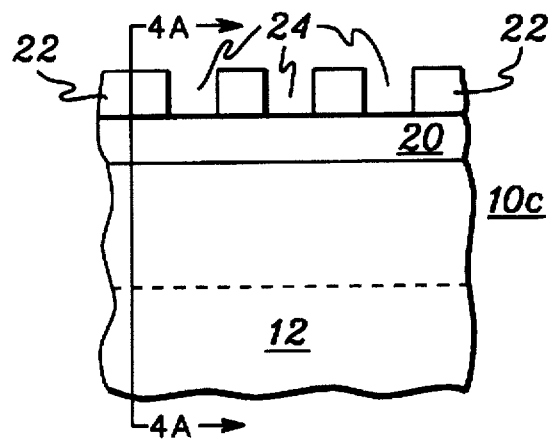
fig. 4A  fig. 4B
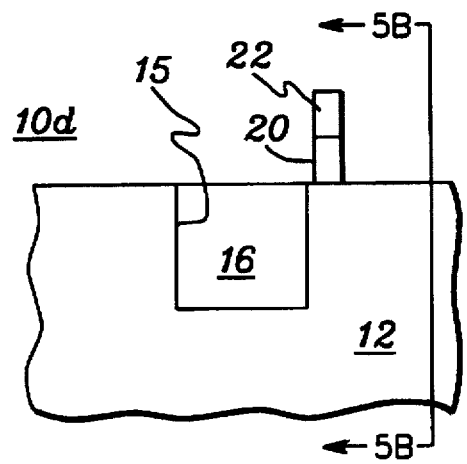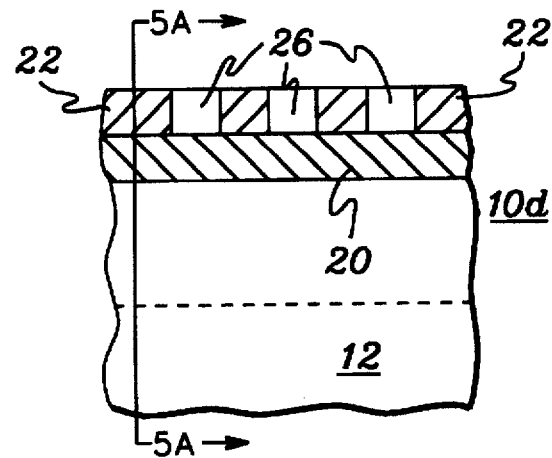
fig. 5A  fig. 5B
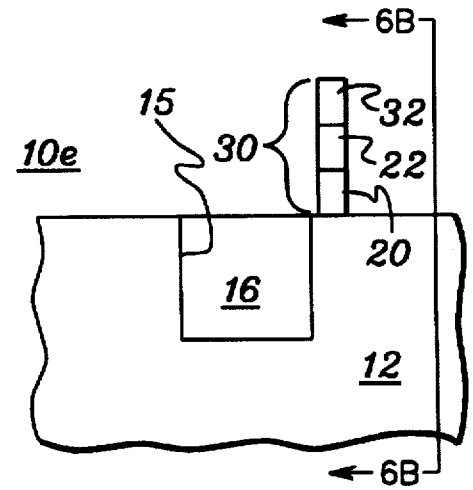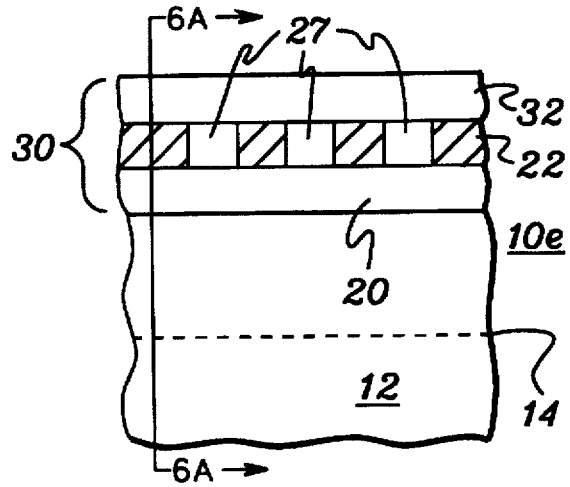
fig. 6A  fig. 6B

VERTICAL MASK FOR DEFINING A REGION ON A WALL OF A SEMICONDUCTOR STRUCTURE

This application is a division of application Ser. No. 08/485,292 filed Jun. 7, 1995 which application is now U.S. Pat. No. 5,668,018.

TECHNICAL FIELD

This invention relates to semiconductor processing, and more particularly, to a device and method for selectively defining a region of masking or implanting on a wall of a semiconductor structure, such as a sidewall of a trench formed in a semiconductor substrate.

BACKGROUND ART

There is an ever-increasing demand for higher levels of integration of semiconductor circuits. As one approach to increasing the density of semiconductor structures, the prior art has integrated devices within the depths of the substrate, in addition to its upper planar surface. For example, dynamic random access memories commonly employ "trenches" for memory cell capacitances. Additionally, slots or trenches are often used to isolate individual devices within monolithic circuits. To further improve monolithic densities, it has been proposed that active semiconductor structures be emplaced within slots/trenches in a substrate. Standard photolithographic techniques, however, are not directly applicable to "personalization" of such concave surface areas.

The prior art shows various approaches to coating concave trench-like structures in semiconductor substrates. Further, the prior art shows that patterns can be produced in such trench areas. For example, reference commonly assigned U.S. Letters Patent issued to Beilstein, Jr. et al., entitled "Process For Positioning A Mask Within A Concave Semiconductor Structure," U.S. Pat. No. 5,096,849. In this patent, a method is described for selectively masking sidewall regions of a concave surface. The method includes the steps of: forming a conformal layer of masking material on a sidewall; emplacing in the concave structure a selectively removable material that partially fills the concave structure, an upper surface of the material defining the edge of a region of the concave structure to be masked; removing a portion of the conformal layer above the upper surface of the selectively removable material; and removing the selectively removable material to leave a region of remaining conformal material as a mask. Although successful in masking the sidewall, this process requires significant in trench processing and limits the mask patterns available.

Thus, a need exists in the semiconductor fabrication art for an improved process technique for selectively defining regions for masking or implanting on a wall of an existing semiconductor structure, such as a sidewall of a substrate trench.

DISCLOSURE OF INVENTION

Briefly summarized, this invention comprises in one aspect a device for use in selectively defining a region for masking on a wall of a semiconductor structure. The device includes a vertical structure disposed above the semiconductor structure and spaced from and extending parallel to the wall. The vertical structure includes an area of one of transparence, reflection or refraction. This area is disposed such that a portion of light projected at a given angle at the wall passes the vertical structure via said area to impinge upon the wall of the semiconductor structure and thereby define the region on the wall.

In another aspect, a device is provided for selectively defining a region for masking or implanting on a wall of a semiconductor structure. This device comprises a vertical mask spaced from and extending parallel to the wall of the semiconductor structure and of sufficient height and width to substantially block a beam projected at a given angle at the wall from hitting the wall. The vertical mask includes at least one aperture therein shaped, sized and positioned such that a portion of said beam passes therethrough to define the desired region on the wall of the semiconductor structure.

In still another aspect, the invention comprises a method for selectively defining a region on a wall of a semiconductor structure. This method includes the steps of: forming a vertical structure above the semiconductor structure and spaced parallel to the wall; providing within the vertical structure an area of one of transparence, reflection or refraction; and projecting light at a given angle to the wall, wherein only a portion of the light passes the vertical structure via the area provided therein to impinge upon the wall of the semiconductor structure and thereby define the region on the wall.

To restate, a vertical structure in accordance with the present invention includes at least one area of one of transparence, reflection or refraction. This area is disposed such that a portion of light projected at a given angle at the wall will pass the vertical structure via the area therein to impinge upon the wall of the semiconductor structure and thereby define a desired region on the wall for masking. The vertical structure can be constructed to function in combination with an optical means for defining the desired region(s) on the sidewall of the trench, which minimizes required processing within the trench. In one embodiment, the vertical structure can comprise a mask having at least one aperture therein which allows for the selective implantation or masking of a desired region on the wall. A wide variety of different shaped regions can be defined on the trench sidewall by judicious choice of designs for the vertical mask. As noted initially, a vertical structure in accordance with this invention can be employed to define a region on any wall of a semiconductor structure, for example, any wall of a concave structure within a semiconductor wafer.

BRIEF DESCRIPTION OF DRAWINGS

These and other objects, advantages and features of the present invention will be more readily understood from the following detailed description of certain preferred embodiments of the invention, when considered in conjunction with the accompanying drawings in which:

FIGS. 4a & 4b are cross-sectional views of the semiconductor structure of FIGS. 3a & 3b subsequent to formation on of a second blocking layer above the first blocking layer, the second blocking layer having multiple openings defined therein;

FIGS. 5a & 5b comprise cross-sectional views of the semiconductor structure of FIGS. 4a & 4b subsequent to filling of the multiple openings in the second blocking layer with a selectively removable material;

FIGS. 6a & 6b comprise cross-sectional views of the semiconductor structure of FIGS. 5a & 5b subsequent to formation of a third blocking layer above the second blocking layer and removal of the selectively removable material from the multiple openings in the second blocking layer;

BEST MODE FOR CARRYING OUT THE INVENTION

As briefly noted above, this invention comprises a novel structure and semiconductor processing method for defining a region on a wall of a semiconductor structure with minimal in-trench processing. Once defined, the region may serve multiple functions. For example, the region may facilitate selective ion implantation or development of a blocking structure or mask pattern in photoresist provided on the wall. Thus, forming of a pattern on a wall of an existing semiconductor structure as provided herein can facilitate the provision of selective density enhancements within the semiconductor structure, and/or the fabrication of micromachine components on the wall of the semiconductor structure.

By way of example, detailed implementations of a device and method in accordance with the present invention are described herein below in connection with defining a region on a sidewall of a substrate trench. However, those skilled in the art will recognize that the concepts presented are not limited in use to a sidewall of a trench. Rather, the inventive features presented can be employed during semiconductor processing to selectively define regions on any wall comprising part of any semiconductor structure.

Figure 1:
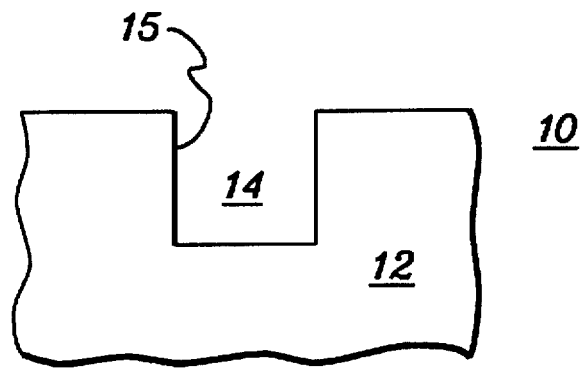
FIG. 1 is a partial cross-sectional view of a semiconductor structure having a trench formed therein with a sidewall to be patterned in accordance with the present invention.
Figure 2:
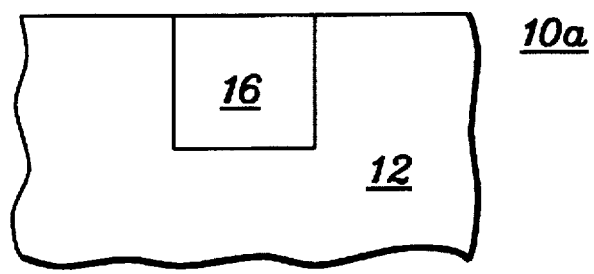
FIG. 2 is a cross-sectional view of the semiconductor structure of FIG. 1 shown with a strippable material filling the substrate trench.

Refer now to the drawings wherein the same reference numbers are used throughout multiple figures to designate the same or similar components. FIG. 1 presents a semiconductor structure 10 comprising, for example, a substrate 12 having a trench 14 formed therein. Note that as an alternative, trench 14 could have been formed within any layer of material disposed above a supporting substrate. In FIG. 2, structure 10a has been defined by trench 14 having been filled with a strippable material 16, such as polyimide, for protection during formation of a vertical blocking structure in accordance with the present invention.

Formation of the vertical blocking structure next occurs. In the embodiment presented, this blocking structure comprises a window or series of windows in an otherwise opaque vertical structure or "wall." As such, the vertical structure can be considered a vertical mask which is positioned adjacent and parallel to the trench and allows angled light to project through the window(s) onto a sidewall 15 of the trench. One embodiment for forming such a structure is set forth in FIGS. 3a–6b.

Figure 3A:
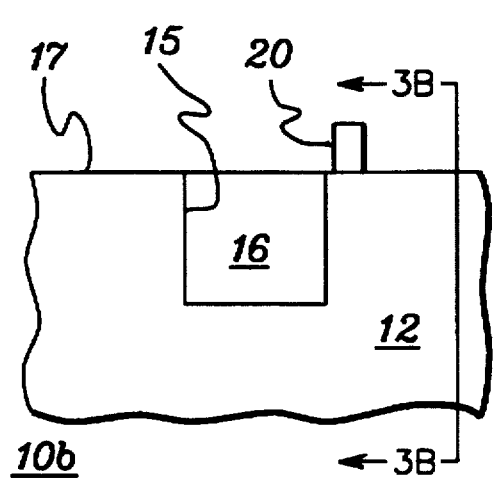
FIGS. 3a & 3b are cross-sectional views of the semiconductor structure of FIG. 2 after a first blocking layer of material has been formed on an upper surface of the substrate in accordance with the present invention.
Figure 3B:
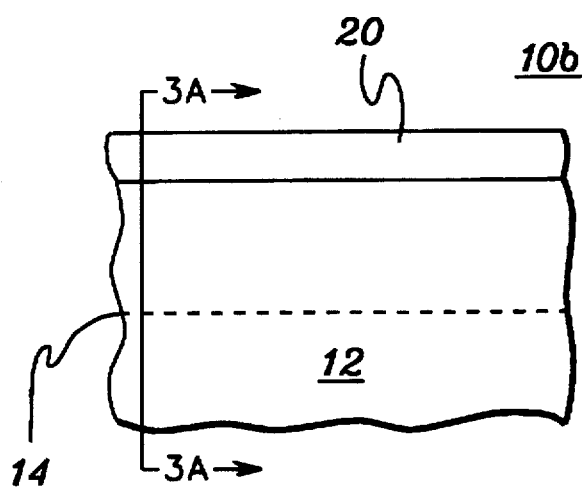

Beginning with FIGS. 3a & 3b, semiconductor structure 10b is obtained by depositing a first blocking layer 20 in the form of a strip of specified thickness adjacent and parallel to the trench formed in substrate 12. By way of example, blocking layer 20 may comprise a layer of metal, such as aluminum. In FIGS. 4a & 4b, semiconductor structure 10c is defined by the provision of a second blocking layer 22 of the same or similar material as first blocking layer 20. Further, second blocking layer 22 is assumed to have a specified thickness substantially the same as layer 20. Formed within second blocking layer 22 are a plurality of openings 24 which are shown to extend down to first blocking layer 20. As an alternative, if the first blocking layer and second blocking layer are fabricated of the same material, then the structure may be formed as a single layer with transverse grooves therein which define the openings. As will be recognized by one skilled in the art, the location, size and configuration of the openings within the second blocking layer will be determined by and directly relate to the desired region(s) to be defined on the sidewall of the trench.

Referring to FIGS. 5a & 5b, semiconductor structure 10d is attained by depositing a third layer of selectively removable material, such as $SiO_2$, to fill the openings 24 in the second blocking layer 22. The upper surface of the vertical mask is planarized so that second blocking layer 22 and oxide layer 26 are at the same height above the substrate surface. The vertical mask 30 is completed by depositing a third blocking layer 32 above second blocking layer 22 to essentially form a blocking cap. Layer 32 is optional, depending upon the height requirement of the wall when serving as a blocking structure for, for example, directional light directed at sidewall 15 of the trench. The next process step is to selectively remove oxide portions 26 from blocking mask 30, e.g., using a wet etch, thereby defining apertures 27 in the vertical mask 30. As an alternative, oxide portions 26 might remain within the vertical mask to function as transparent areas. Finally, strippable material 16 would be removed from the substrate trench. If desired, a photoresist would then be applied to sidewall 15 of the trench for selective patterning using the vertical mask. Photoresist can be applied to sidewall 15 of the trench using any one of a number of available techniques. For example, after strippable material 16 is removed, a photoresist could be applied, planarized and then masked such that when exposed and developed the photoresist resides only along the sidewalls or one sidewall of the trench.

Figure 7:
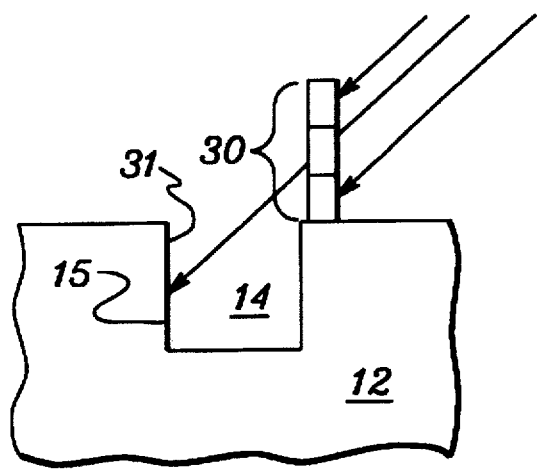
FIG. 7 is a partial cross-sectional view of the semiconductor structure of FIGS. 6a & 6b in accordance with the present invention shown in use for defining a region for masking or implanting on the sidewall of the substrate trench.
Figure 10:
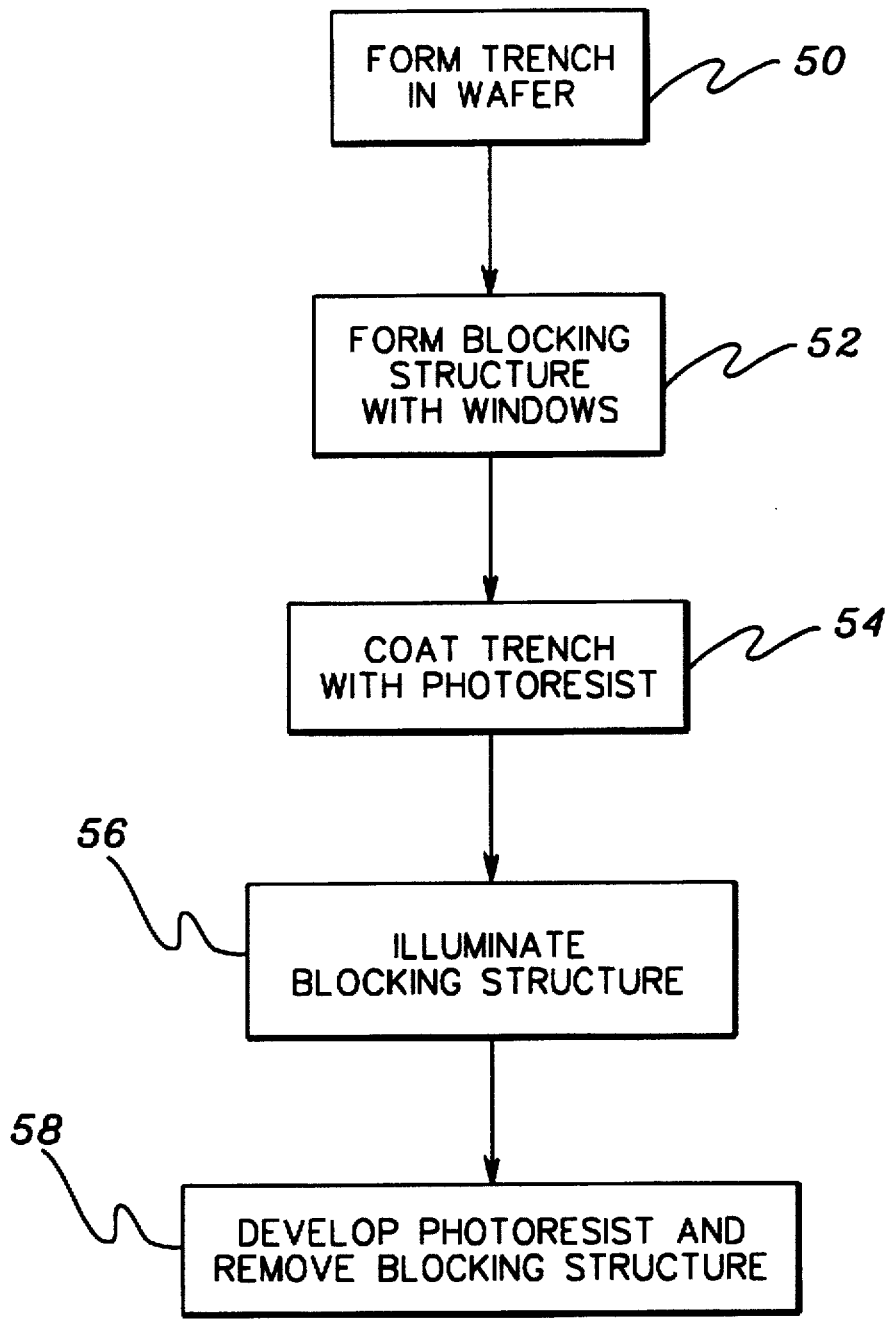
FIG. 10 is a flowchart overview of one embodiment of sidewall processing employing a blocking structure in accordance with the present invention.

A partial cross-sectional view of vertical mask 30 in use is depicted in FIG. 7. As shown, a light beam impinging upon the vertical mask at a given angle is only allowed to project through the one or more apertures therein onto the sidewall of the trench, which is coated with a light-sensitive material 31, such as a high contrast photoresist. An overview of one method for employing the vertical mask in accordance with the present invention is depicted in FIG. 10. As outlined, this method includes first forming a trench in the wafer (50) and then forming a vertical blocking structure in accordance with the present invention having at least one aperture therein (52). After the vertical mask has been formed, the trench sidewall is coated with a photoresist material (54) and the vertical blocking structure is illuminated with a directional, incoherent or partially coherent light (56). The final step is to develop the photoresist and remove the blocking structure (58) such that the result is patterned photoresist on the sidewall of the substrate trench.

Note that illumination of the wall structure should be highly directional and incoherent. High directionality provides sharpness to the shadow cast onto the trench sidewall, while incoherence eliminates interference fringes caused by defraction of light from the edges of the aperture in the vertical mask. The size of the aperture needed is determined by the direction of illumination and the required size of the trench wall feature. As will be understood by those skilled in the art, for a required projection area A on the trench wall, the area of the aperture needs to be A/CosB, where B is the angle of the illumination relative to the window normal. Further, use of a high contrast resist allows for the quality of the shadow cast on the trench wall to be rather poor and still create a sharp structure. Finally, as the scale of the aperture gets to be on the order of the wavelength of light, detraction effects will cause a reduction in shadow contrast, which will result in extreme sensitivity to changes in exposure time.

Figure 8:
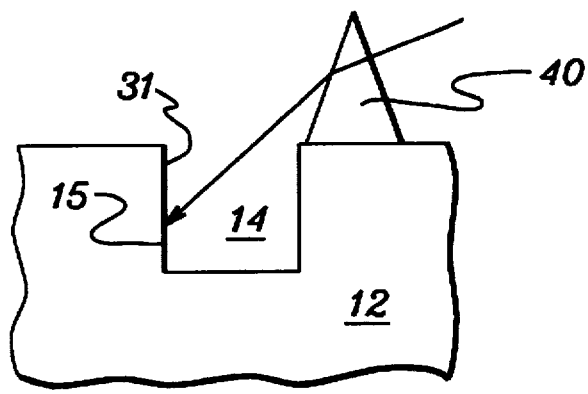
FIG. 8 is a partial cross-sectional view of a semiconductor structure and an associated prism-shaped refracting structure in accordance with the present invention for defining a region for masking on the sidewall of a substrate trench.
Figure 9:
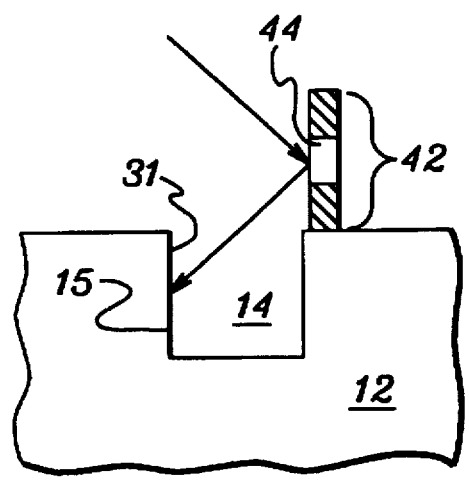
FIG. 9 is a partial cross-sectional view of a semiconductor structure having a vertical structure with a reflecting area in accordance with an alternate embodiment of the present invention, the reflecting area facilitating defining of a region for masking on the sidewall of the substrate trench.

FIGS. 8 & 9 depict two alternate embodiments of a vertical structure in accordance with the present invention. In FIG. 8, a prism-shaped vertical structure 40 has been formed above substrate 12 such that light rays impinging upon structure 40 are deflected downward onto the trench sidewall 15. As a variation on the structure of FIG. 8, vertical structure 40 could be merged with vertical structure 30 of FIG. 7 by providing prism lenses only within the apertures defined in the blocking structure. In FIG. 9, the vertical structure 42 is shown to comprise at least one region 44 of reflection such that a light beam impinging thereon is reflected onto sidewall 15 of trench 14 in substrate 12.

One skilled in the art will understand from the above discussion that a vertical structure in accordance with the present invention includes at least one area of one of transparence, reflection or refraction. This area is disposed such that a portion of light projected at a given angle at the vertical structure will pass via the area of transparence, reflection or refraction to impinge upon the wall of the semiconductor structure and thereby define a desired region on the wall. The vertical structure can be constructed to function in combination with an optical means for defining the desired region(s) on the sidewall of the trench, which minimizes required processing within the trench. In one embodiment, the vertical structure can comprise a mask having at least one aperture therein which allows for the selective implantation or masking of a desired region on the wall. A wide variety of different shaped regions can be defined on the trench sidewall by judicious choice of designs for the vertical mask. As noted initially, a vertical structure in accordance with this invention can be employed to define a region on any wall of any semiconductor structure, for example, any wall of a concave structure within a semiconductor wafer.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A device for use in selectively defining a region on a wall of a semiconductor structure, said device comprising:

a vertical structure disposed above said semiconductor structure and having a surface spaced from and extending parallel to said wall; and wherein a portion of said surface of said vertical structure comprises an area of one of transparence, reflection or refraction, and wherein said area is disposed such that a portion of light projected at a given angle at said vertical structure passes via said area of said surface extending parallel to said wall to impinge upon said wall of said semiconductor structure and thereby define said region on said wall.

2. The device of claim 1, wherein said vertical structure is of sufficient height and width to substantially block light projected at said given angle from impinging on said wall, wherein only said portion of light passes via said area of said surface extending parallel to said wall to impinge upon said wall of said semiconductor structure.

3. The device of claim 2, wherein said wall comprises a sidewall of a trench formed in a semiconductor substrate, and wherein said vertical structure is disposed on an upper surface of said substrate with said surface of said vertical structure disposed substantially perpendicular to said upper surface of said substrate.

4. The device of claim 1, wherein said vertical structure comprises a stack of multiple blocking layers, at least one blocking layer containing said area of one of transparence, reflection or refraction at said surface of said vertical structure.

5. The device of claim 1, wherein said vertical structure includes a body composed of a first material and wherein said portion of said surface comprising said area is composed of a second material, said second material being different from said first material.

6. The device of claim 1, wherein multiple portions of said surface of said vertical structure comprise multiple areas, each area comprising an area of one of transparence, reflection or refraction.

7. A device for selectively defining a region on a wall of a semiconductor structure, said device comprising:

a vertical mask having a surface spaced from and parallel to said wall of the semiconductor structure, said vertical mask being of sufficient height and width to block a beam projected at a given angle at said wall from hitting said wall; and wherein said vertical mask includes at least one aperture in said surface disposed parallel to said wall of the semiconductor structure, said at least one aperture being shaped and sized such that a portion of said beam passes therethrough to define said region on said wall of said semiconductor structure.

8. The device of claim 7, wherein said wall comprises a sidewall of a trench formed in a semiconductor substrate and wherein said vertical mask is disposed upon an upper surface of said substrate with said surface parallel to said wall of the semiconductor structure being disposed perpendicular to said upper surface of said substrate.

9. The device of claim 7, further in combination with means for projecting said beam at a given angle to said wall, said beam comprising a collimated light beam, only said portion of which passes through said at least one aperture in said surface of said vertical mask to impinge upon said wall and thereby define said region on said wall.

10. A device for selectively defining a region on a wall of a semiconductor structure, said device comprising:

a vertical mask spaced from and parallel to said wall of the semiconductor structure and of sufficient height and width to block a beam projected at a given angle at said wall from hitting said wall;

wherein said vertical mask includes at least one aperture therein shaped such that a portion of said beam passes therethrough to define said region on said wall of said semiconductor structure; and wherein said vertical mask is composed of multiple layers disposed in a stack with one layer atop another layer, and wherein said at least one aperture resides within at least one layer of said multiple layers.

11. A device for use in selectively defining a region on a wall of a semiconductor structure, said device comprising:
a vertical structure disposed above said semiconductor structure and having a main surface spaced from and extending parallel to said wall; and
wherein said main surface of said vertical structure includes an area of one of transparence, reflection or refraction, and wherein said area is disposed such that a portion of light projected at a given angle at said vertical structure passes via said area of said main surface to impinge upon said wall of said semiconductor structure and thereby define said region on said wall.

12. A device for use in selectively defining a region on a wall of a semiconductor structure, said device comprising:
a prism structure disposed above said semiconductor structure and spaced from said wall; and
wherein light projected at a given angle at said prism structure passes through said prism structure and is deflected onto said wall of said semiconductor structure to thereby define said region on said wall.

* * * * *